United States Patent [19]
Kim

[11] Patent Number: 6,148,009
[45] Date of Patent: Nov. 14, 2000

[54] TIMING SIGNAL SUPPLYING DEVICE OF DOUBLED TIMING SYNCHRONOUS SYSTEM

[75] Inventor: Jong-Youn Kim, Kyungki-do, Rep. of Korea

[73] Assignee: LG Information & Communications, Ltd., Seoul, Rep. of Korea

[21] Appl. No.: 08/974,456

[22] Filed: Nov. 20, 1997

[30] Foreign Application Priority Data

Nov. 21, 1996 [KR] Rep. of Korea ..................... 96-56065

[51] Int. Cl.[7] ................. H04J 3/07; H04J 3/06; H04L 7/00
[52] U.S. Cl. ....................... 370/506; 370/518; 375/372
[58] Field of Search .................... 370/503, 516, 370/517, 518; 375/372, 376

[56] References Cited

U.S. PATENT DOCUMENTS

| | | |
|---|---|---|
| 4,811,340 | 3/1989 | McEachern et al. ............... 375/372 |
| 4,928,275 | 5/1990 | Moore et al. ...................... 375/372 |
| 5,202,904 | 4/1993 | Kamada ............................. 375/372 |
| 5,835,543 | 11/1998 | Mazzurco et al. ................. 370/516 |

*Primary Examiner*—Chau Nguyen
*Assistant Examiner*—Phuongchau Ba Nguyen
*Attorney, Agent, or Firm*—Fleshner & Kim, LLP

[57] ABSTRACT

A timing signal supplying device in a doubled timing synchronous system includes: a timing signal adjusting portion which feeds back a timing signal of a timing signal receiving circuit and a frequency signal of a transmitting buffer to regenerate a timing signal and compares the timing signal with an external input timing signal to detect and correct an error of the timing signal; and a timing signal transmitting portion which sequentially transmits the corrected signal of the timing signal adjusting portion and the regenerated timing signal to the timing signal receiving circuit.

6 Claims, 2 Drawing Sheets

TIMING SIGNAL SUPPLYING DEVICE OF DOUBLED TIMING SYNCHRONOUS SYSTEM

BACKGROUND OF THE INVENTION

1. Field of the Invention

The present invention relates to a doubled timing synchronous system, and more particularly, to a timing signal supplying device in a doubled timing synchronous system which can correct a timing error in an external input timing signal and in a timing signal inputted to a timing signal receiving circuit.

2. Discussion of Related Art

Generally, a timing signal is transmitted to a base station or terminal device to ensure synchronization of input/output data to and from transmitting/receiving sides in a mobile communication system.

FIG. 1 is a schematic block diagram illustrating a representative doubled timing synchronous system, and FIG. 2 is a block diagram illustrating a timing signal supplying device of FIG. 1.

Referring to FIG. 1, a conventional doubled timing synchronous system inputs a timing signal generated in a timing signal generator (not shown), with a clock signal, to a timing signal supplying circuit 1 and then the timing signal synchronized according to the clock signal is outputted to a plurality of timing signal receiving circuits 11.

Referring to FIG. 2, a conventional timing signal supplying device includes a phase locked loop (hereinafter simply referred to as "PLL") circuit 2 which receives the clock signal generated from a clock generator (not shown) and outputs a predetermined frequency signal; and a transmitting buffer 3 which sequentially transmits the frequency signal from the PLL circuit 2 and an external input timing signal to the timing signal receiving circuit 11.

In operation, the PLL circuit 2 serves to stabilize the clock signal inputted from the exterior and output it as the predetermined frequency signal, and the transmitting buffer 3 serves to transmit the input timing signal and the frequency signal to the timing signal receiving circuit 11.

As shown in FIG. 1, the conventional timing signal supplying device is doubled to supply a stabilized timing signal. Thus, when an enable terminal of the transmitting buffer 3 is in an active state, only an activated timing signal supplying circuit is operated and the other is in a stand-by state.

In the conventional timing signal supplying device, however, even if there occurs timing loss caused due to the separation and operation of the doubled circuit, there is a problem in that the timing signal to be inputted to the transmitting buffer is not synchronous to the timing signal to be inputted to the timing signal receiving circuit.

SUMMARY OF THE INVENTION

Accordingly, the present invention is directed to a timing signal supplying device in a doubled timing synchronous system that substantially obviates one or more of the problems due to limitations and disadvantages of the related art.

An object of the invention is to provide a timing signal supplying device in a doubled timing synchronous system which can synchronize an input timing signal with a timing signal inputted to a timing signal receiving circuit.

To accomplish this and other objects of the present invention, a timing signal supplying device in a doubled timing synchronous system includes: a timing signal adjusting portion which feeds back a timing signal of a timing signal receiving circuit and a frequency signal of a transmitting buffer to regenerate a timing signal and compares the timing signal with an external input timing signal to detect and correct timing error of the timing signal; and a timing signal transmitting portion which sequentially transmits the corrected signal of the timing signal adjusting portion and the regenerated timing signal to the timing signal receiving circuit.

Preferably, the timing signal transmitting portion is comprised of a PLL circuit which serves to stabilize a clock in a reference frequency and the transmitting buffer which outputs the clock signal of the PLL circuit and the regenerated timing signal to a plurality of timing signal receiving circuits.

Further, the timing signal adjusting portion preferably includes: a receiving buffer fur inputting the timing signal and the clock signal from the transmitting buffer; a multiplexer for connecting an input timing signal, upon an initial operation of the system, to an output terminal thereof and for connecting an output timing signal inputted from the receiving buffer, upon an normal operation of the system, to an output terminal thereof; a timing signal regenerator connected to the multiplexer, the receiving buffer and the transmitting buffer, tor inputting the clock signal from the receiving buffer to generate a regenerated timing signal in accordance with a synchronous timing signal inputted from the multiplexer; and a timing signal comparing processor connected to the timing signal regenerator and the PLL circuit, for detecting timing error in the input timing signal and the regenerated timing signal to output the detected timing error to the PLL, circuit.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

DETAILED DESCRIPTION OF PREFERRED EMBODIMENT

Reference will now be made in detail to the preferred embodiments of the present invention, examples of which are illustrated in the accompanying drawings.

An explanation of the construction and operation of a timing signal supplying device in a doubled timing synchronous system according to the present invention will be in detail discussed with reference to FIG. 3.

Figure 1:
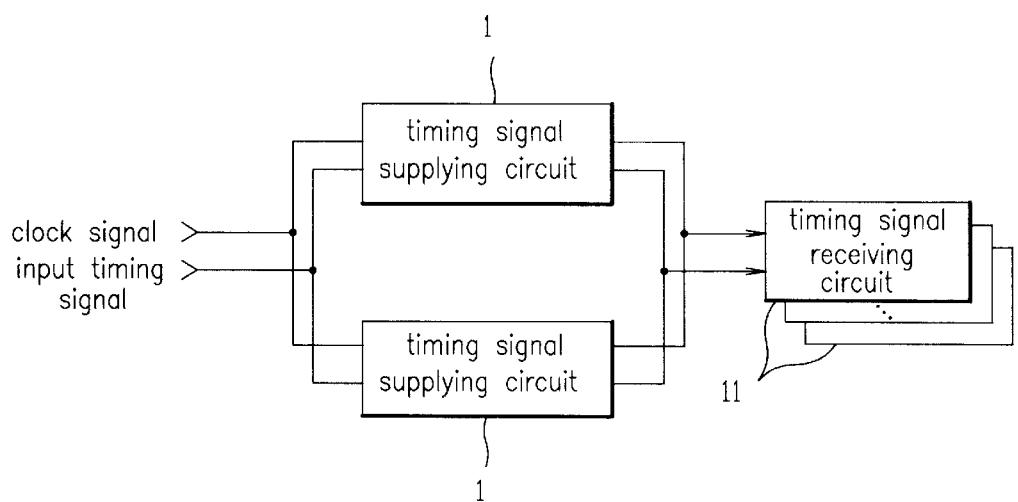
FIG. 1 is a schematic block diagram illustrating a representative doubled timing synchronous system.
Figure 2:
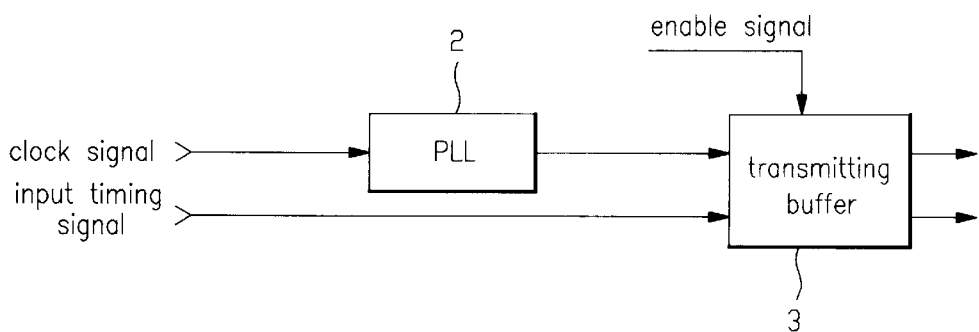
FIG. 2 is a block diagram illustrating a timing signal supplying device of FIG. 1.
Figure 3:
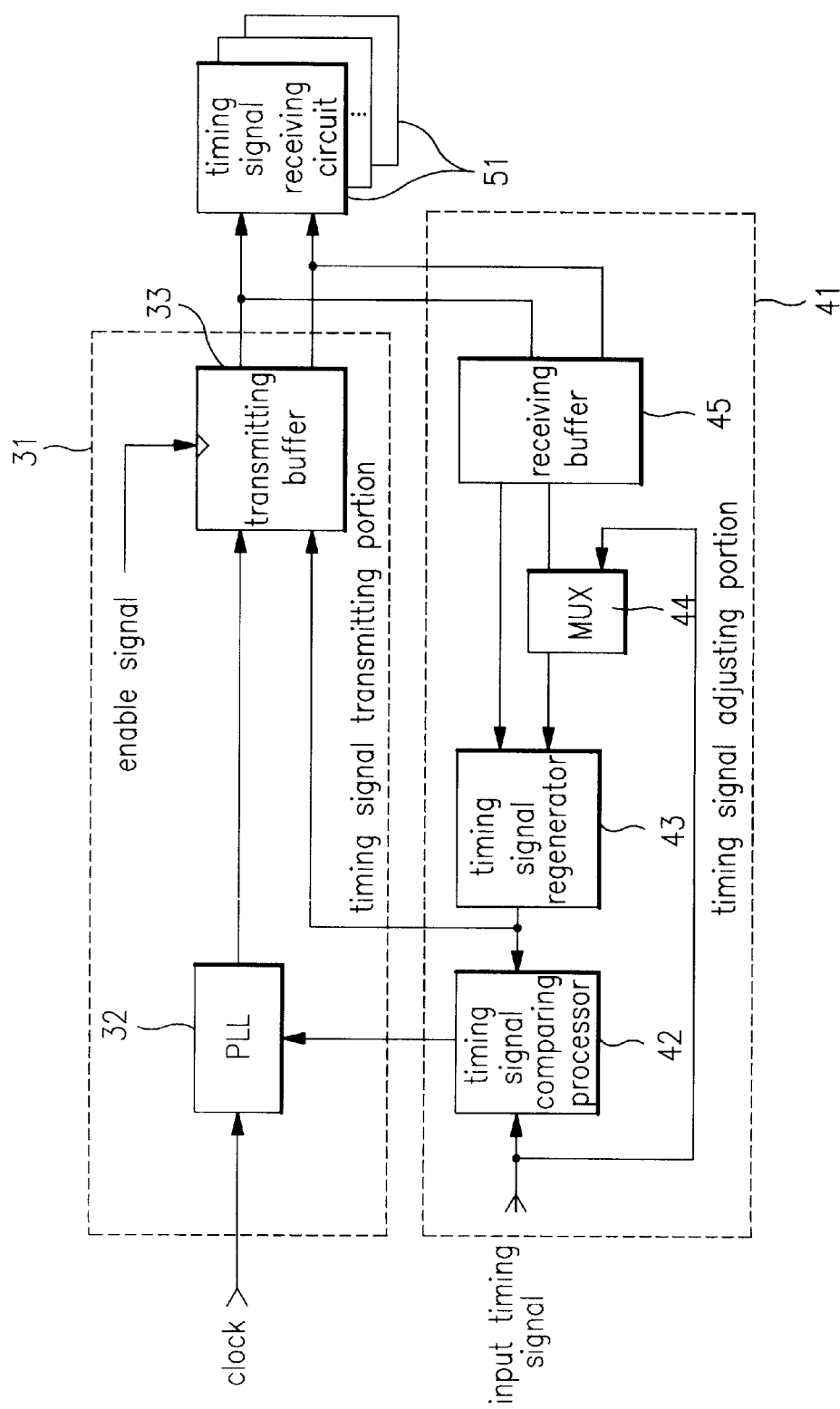
FIG. 3 is a block diagram illustrating a timing signal supplying device in a doubled timing synchronous system constructed according to the present invention.

FIG. 3 is a block diagram illustrating a timing signal supplying device in a doubled timing synchronous system constructed according to the present invention.

Referring to FIG. 3, the timing signal supplying device according to the present invention includes a timing signal transmitting portion 31 and a timing signal adjusting portion 41. In more detail, a timing signal and a clock signal of a timing signal receiving circuit 51 are fed back to the timing signal adjusting portion 41, in which a timing signal is regenerated. Then, the regenerated timing signal is compared with an external input timing signal and a timing error in the timing signal is detected to correct the timing error. Thus, upon generation of clock loss or insertion of noise clock, an output timing signal is synchronized with an input timing signal.

The timing signal transmitting portion 31 is comprised of a PLL circuit 32 which serves to stabilize a clock in a reference frequency and a transmitting buffer 33 which is connected to the PLL circuit 32 to output the clock signal of the PLL circuit and the regenerated timing signal to a plurality of timing signal receiving circuits 51.

Further, the timing signal adjusting portion 41 preferably includes: a receiving buffer 45 for inputting the timing signal and the clock signal from the transmitting buffer 33; a multiplexer 44 for connecting an input timing signal, upon an initial operation of the system, to an output terminal thereof and for connecting an output timing signal inputted from the receiving buffer 45, upon an normal operation of the system, to an output terminal thereof; a timing signal regenerator 43 connected to the multiplexer 44, the receiving buffer 45 and the transmitting buffer 33, for inputting the clock signal from the receiving buffer 45 to generate a regenerated timing signal in accordance with a synchronous timing signal inputted from the multiplexer 44; and a timing signal comparing processor 42 connected to the timing signal regenerator 43 and the PLL circuit 32, for detecting timing error in the input timing signal and the regenerated timing signal to output the detected timing error to the PLL circuit 32.

The PLL circuit 32 is connected to a clock generator (not shown) to stabilize a clock in a reference frequency, and the transmitting buffer 33 is connected to the PLL circuit 32 to output the clock signal of the PLL circuit and the regenerated timing signal to the plurality of timing signal receiving circuits 51.

The receiving buffer 45 is connected to the transmitting buffer 33 of the timing transmitting portion 31, and if the clock signal and the timing signal are inputted from the transmitting buffer 33, the receiving buffer 45 applies the input timing signal to one input terminal of the timing signal regenerator 43 upon initialization of the system and applies the output timing signal inputted from the receiving buffer 45 to the other input terminal of the timing signal regenerator 43 upon a normal operation of the system.

The timing signal regenerator 43 is connected to an output terminal of the multiplexer 44, the one output terminal of the receiving buffer 45, and the one output terminal of the transmitting buffer 33 and receives the clock signal from the receiving buffer 45 to generate the regenerated timing signal in accordance with the synchronous timing signal inputted from the multiplexer 44.

The timing signal comparing processor 42 is connected to an output terminal of the timing signal regenerator 43 and the other input terminal of the PLL circuit 32, for detecting. timing error in the input timing signal and the regenerated timing signal to thereby output the detected timing error to the PLL circuit 32.

The timing signal which is generated in a timing input signal generator (not shown) is called the "input timing signal", the timing signal which is fed back to the transmitting buffer 33 and the receiving buffer 45 is called the "output timing signal", and the timing signal which is outputted from the multiplexer 44 is called the "synchronous timing signal". At the time, upon initialization of the system, the input timing signal becomes the synchronous timing signal, and contrarily, upon the normal operation of the system, the output timing signal becomes the synchronous timing signal.

In the timing signal adjusting portion as constructed above, if there occurs loss in the clock outputted from the transmitting buffer 33 due to malfunction of the device or insertion of an external clock due to generation of noise, the regenerated timing signal and the input timing signal are each generated in different timing from the timing signal regenerator 43 and thus the timing signal comparing processor 42 detects the timing error to thereby adjust the PLL circuit 32 with the detected timing error.

The PLL circuit 32 pulls the clock, if the generation of the regenerated timing signal is slower than that of the input timing signal, and loosens it, if faster. This is periodically repeated until the regenerated timing signal is synchronous with the input timing signal.

As clearly apparent from the foregoing, a timing signal supplying device in a doubled timing synchronous system according to the present invention can feed back a timing signal and a clock signal which are inputted to a timing signal receiving circuit to generate a regenerated timing signal, compare the regenerated timing signal with the input timing signal to detect the timing error and correct the timing error by means of the PLL circuit, so that the output timing sinal can be synchronized with the input timing signal even upon generation of clock loss or insertion of noise clock.

Therefore, a timing signal supplying device according to the present invention can supply a stabilized timing signal to the timing signal receiving circuit to ensure the synchronization of input/output data in a mobile communication system.

It will be apparent to those skilled in the art that various modifications and variations can be made in a timing signal supplying device in a doubled timing synchronous system of the present invention without departing from the spirit or scope of the invention. Thus, it is intended that the present invention cover the modifications and variations of this invention provided they come within the scope of the appended claims and their equivalents.

What is claimed is:

1. A timing signal supplying device in a doubled timing synchronous system having a doubled timing signal supplying circuit with a transmitting buffer and a timing signal receiving circuit, said device comprising:

a timing signal adjusting portion for feeding back a timing signal for said timing signal receiving circuit and a frequency signal of said transmitting buffer to regenerate a timing signal and for comparing a timing signal with an external input timing signal to detect and correct an error of a timing signal; and a timing signal transmitting portion for sequentially transmitting the corrected signal of said timing signal adjusting portion and the regenerated timing signal to said timing signal receiving circuit, wherein said timing signal adjusting portion is comprised of: a receiving buffer for inputting the timing signal and the clock signal from said transmitting buffer; a multiplexer for connecting an input timing signal, upon an initial operation of the system, to an output terminal thereof and for connecting an output timing signal inputted from said receiving buffer, upon a normal operation of the system, to an output terminal thereof; a timing signal regenerator connected to said multiplexer, said receiving buffer and said transmitting buffer, for inputting the clock signal from said receiving buffer to generate a regenerated timing signal in accordance with a synchronous timing signal inputted from said multiplexer; and a timing signal comparing processor connected to said timing signal regenerator and a phase locked loop circuit, for detecting timing error in the input timing signal and the regenerated timing signal to output the detected timing error to said phase locked loop circuit.

2. The device as defined in claim 1, wherein said receiving buffer is connected to said transmitting buffer of said timing transmitting portion and if the clock signal and the timing signal are inputted from said transmitting buffer, applies the input timing signal to one input terminal of said timing signal regenerator upon initialization of the system and applies the output timing signal inputted from said receiving buffer to the other input terminal of said timing signal regenerator upon a normal operation of the system.

3. The device as defined in claim 1, wherein said timing signal regenerator is connected to an output terminal of said multiplexer, the one output terminal of said receiving buffer, and the one output terminal of said transmitting buffer and receives the clock signal from said receiving buffer to generate the regenerated timing signal in accordance with the synchronous timing signal inputted from said multiplexer.

4. The device as defined in claim 1, wherein said timing signal comparing processor is connected to an output terminal of said timing signal regenerator and the other input terminal of said PLL circuit, for detecting timing error in the input timing signal and the regenerated timing signal to output the detected timing error to said phase locked loop circuit.

5. The device as defined in claim 1, wherein said timing signal transmitting portion is comprised of said phase locked loop circuit connected to a clock generator, for stabilizing a clock in a reference frequency and said transmitting buffer connected to said phase locked loop circuit to output the clock signal of said phase locked loop circuit and the regenerated timing signal to a plurality of timing signal receiving circuits.

6. The device as detined in claim 5, wherein said transmitting buffer is connected to said phase locked loop circuit to output the clock signal of said phase locked loop circuit and the regenerated timing signal to the plurality of timing signal receiving circuits.

* * * * *